United States Patent [19]

Fujimura et al.

[11] Patent Number: 4,699,859

[45] Date of Patent: Oct. 13, 1987

[54] DOT-ETCHABLE IMAGE-CONTAINING ELEMENT USEFUL IN LITHOGRAPHIC MASK FORMATION AND ITS PRODUCTION

[75] Inventors: Toshiaki Fujimura; Yoshio Katoh; Satoshi Imahashi, all of Otsu; Koichi Seto, Kobe; Shinichi Tanaka, Shiga, all of Japan

[73] Assignee: Toyo Boseki Kabushiki Kaisha, Osaka, Japan

[21] Appl. No.: 648,095

[22] Filed: Sep. 7, 1984

[51] Int. Cl.[4] ............................ G03C 1/68; G03F 7/02
[52] U.S. Cl. ...................................... 430/18; 430/331; 430/917; 430/918; 430/423; 430/424; 430/309
[58] Field of Search ................. 430/331, 917, 918, 18, 430/423, 424, 309

[56] References Cited

U.S. PATENT DOCUMENTS 2,993,789  7/1961  Crawford ........................... 430/325
4,173,673  11/1979  Bratt et al. .............................. 430/5
4,174,218  11/1979  Pohl ..................................... 430/309
4,328,304  5/1982  Tachikawa et al. ................ 430/331
4,419,438  12/1983  Etoh et al. ........................... 430/279
4,528,261  7/1985  Hauser ........................... 430/311 X

OTHER PUBLICATIONS

"An Improved Process for Staging Photopolymerized Dot-Etchable Masks", *Research Disclosure*, No. 21924, Jul. 1982, pp. 261–265.

*Primary Examiner*—John E. Kittle
*Assistant Examiner*—Cynthia Hamilton

[57] ABSTRACT

A reducible image-containing element which comprises a support material and a photopolymerized layer provided thereon, said photopolymerized layer having an image area which is cured at the upper part and not cured at the lower part, said non-cured lower part containing at least one of polyvalent phenols and their derivatives in an amount effective in preventing said non-cured lower part from curing.

1 Claim, No Drawings

DOT-ETCHABLE IMAGE-CONTAINING ELEMENT USEFUL IN LITHOGRAPHIC MASK FORMATION AND ITS PRODUCTION

The present invention relates to a reducible image-containng element and its production.

On imagewise exposure of a photosensitive element, a mask is normally used containing an image which is opaque to actinic radiation. Namely, a photosensitive element comprises a support material (e.g. a metal plate, a plastic plate) and a photopolymerizable layer provided thereon, and the photopolymerizable layer is exposed to actinic light through a mask, whereby the photopolymerizable layer at the exposed areas is cured to give a photopolymerizable layer. After exposure, the element is treated with a developer to remove the non-cured photosensitive composition at the unexposed areas while leaving a relief or resist image. For this purpose, the image in the mask must be of the highest possible contrast, e.g. completely opaque black in the image areas and completely transparent (free from fog) in the non-image areas.

In printing, preparation of a mask having a dot image (i.e. and image comprised of dots) in needed; e.g. an original image is first decomposed into dots by a photographic procedure to make a dot image; this dot image is then converted into an invertaed dot image by the use of a second image copying material. In order to make the dot image better, the operations of contact and inversion are repeated. A film having the dot image as ultimately obtained is used as a mask. Through this mask, a photosensitive element is exposed to actinic ligh and treated with a developer to obtain a printing film having a dot image. Said second image copying material is usually called as "a litho-film for inversion-inversion".

Hitherto, various studies have been made on litho-films suitable for said use. Such litho-films are usually prepared by the use of silver salts such as silver halide. Silver salt litho-films are advantageous in having high sensitivity. However, certain limitations are present in respect to the contrast and the disappearance of fringe. Further, the latitiude of exposure and development is narrow. When dot-etched for reduction, the optical density is lowered. In addition, they are sensitive to visible light so that the operation for image copying must be carried our in a dark room. This is a big problem for the viewpoint of workability and labor environment.

In order to reduce the cost and solve the resource problem and for overcoming various drawbacks in silver salt films, there has recently been proposed a non-silver salt film element comprising a support material and a photopolymerizable layer provided thereon, said photopolymerizable layer being covered by a protective layer provided thereon, and having an optical density of not less than 3 to actinic radiation (Japanese Patent Publn. (unexamined) No. 62427/77). This non-silver litho-film can be processed under bright light and affords a mask having a high contrast without any fringe by simple operation, e.g. imagewise exposing, water rinsing, alkali dipping, spraying, water rinsing and drying. The obtained mask is characterized in being readily tone-corrected by dot etching, e.g. treatment with an aqueous alkali solution and rinsing with water.

On tone correction by dot etching, however, said non-silver salt litho-film produces considerable differences in reduction property depending on the conditions for treatment and/or storage before application of the reduction operation, i.e. dot etching, thereto. When, for instance, the temperature for drying is high, the storage condition is poor or the exposure to bright light takes place, the reduction property is lowered or lost due to the progress of the thermal reaction or the photopolymerizaton or crosslinking reaction.

As a result of the extensive study to make an image-containing litho-film which can retain the reduction property irrespective of the thermal reaction on or after the development as well as the exposure to actinic radiation on the handling, it has now been found that the application of a polyvalent phenol or its derivative to the image-containing litho-film is effective in retention of the reduction property.

The term "reduction" in this specification is intended to mean reduction of the size of the halftone dots which constitute an image, thereby changing the tone value or color strength of the image. It may be understood to have the same meaning as "dot-etching". Therefore, the term "reduction property" means a capability of being reduced in size or being dot-etched.

According to the present invention, there is provided a reducible image-containing element which comprises a support material and a photopolymerized layer provided thereon, said photopolymerized layer having an image area which is cured at the upper part and not cured at the lower part, said non-cured lower part containing at least one of polyvalent phenols and their derivatives in an amount effective in preventing said non-cured lower part from curing.

The reducible image-containing element of the invention comprises a support material and a photopolymerizable layer provided thereon, and it can be produced by exposure of a photosensitive element comprising a support material and a photopolymerizable layer provided thereon to actinic radiation, said photopolymerizable layer being a layer of a photosensive composition comprising a polymerizable monomer, a polymeric binder, a photopolymerization initiator and an actinic light absorber.

The reducible image-containing element includes an image area which is cured at the upper part and not cured at the lower part. In other words, the image area has a higher degree of polymerization or curing at the upper part with the highest at the surface and a lower degree of polymerization or curing at the lower part with the lowest at the bottom. Said state can be readily produced by subjecting a photopolymerizable layer showing a certain suitable absorption to actinic light to imagewise exposure. In order to impart such suitable absorption to the photopolymerizable layer, a proper amount of an actinic light absorber as hereinafter mentioned may be incorporated into the photosensitive compositon of which the polymerizable layer is made.

As the support material, there may be used a glass plate, a plastic film, a metal plate, a paper sheet, etc. There may be also used a glass plate or plastic film bearing a thin layer of a metal or a metallic compound at the surface. Examples of the plastic film are films of polyolefins (e.g. polyethylene, polypropylene), polyvinyl or polyvinylidene halides (e.g. polyvinyl chloride, polyvinylidene chloride), cellulose derivatives (e.g. cellulose acetate, nitrocellulose, cellophane), polyamides, polyesters, polystyrene, polycarbonates, polyimides, etc. The plastic film may be made of a single kind of or two or more kinds of polymers, and it may be a monolayer film or a multi-layer or composite film. Particularly preferred is a biaxially stretched polyethylene terephthalate film having good size stability and high transparency. For formation of a thin layer of a metal or a metallic compound on the surface of a glass plate or plastic film, there may be adopted any conventional procedure such as vaporization, sputtering, ionized static plating or plating. As the metal to be used, aluminum is the most preferable in view of easy handling, low cost, less toxicity, etc. The support material may have any coating layer thereon for the purpose of improvement of the adhesiveness to a photosensitive layer to be provided thereon or any other purpose.

The photopolymerizable layer may be formed by the use of a photosensitve composition which comprises at least one polymerizable monomer, at least one polymeric binder, at least one photopolymerization initiator and at least one actinic light absorber, optionally with any additive(s) such as a stabilizer, a plasticizer, a surfactant and a coloring agent.

As the polymerizable monomer, there may be used any one having at least one polymerizable double bond. Specific examples are alkyl acrylates or methacrylates (e.g. hexyl acrylate, hexyl methacrylate, lauryl acrylate, lauryl methacrylate), cycloalkyl acryates or methacrylates (e.g. cyclohexyl acrylate, cyclohexyl methacrylate), aralkyl acrylates or methacrylates (e.g. benzyl acrylate, benzyl methacrylate), hydroxyalkyl acrylates or methacrylates, N-dialkylaminoalkyl acrylates or methacrylates, alkoxyalkyl acrylates or methacrylates (e.g. methoxyethyl acrylate, ethoxyethyl methacrylate), haloalkyl acrylates or methacrylates, acrylamide or methacrylamide, polyalkylether acrylates or methacrylates (e.g. diethyleneglycol diacrylate, diethyleneglycol dimethacrylate, triethyleneglycol diacrylate, triethyleneglycol dimethacrylate), polyvalent alcohol acrylates or methacrylates (e.g. ethyleneglycol diacrylate, ethyleneglycol dimethacrylate, glycerol triacrylate, glycerol trimethacrylate, trimethylolpropane acrylate, trimethylolpropane methacrylate, pentaerythritol acrylate, pentaerythritol methacrylate), acrylic acid or methacrylic acid, reaction products of glycidyl acrylate or methacrylate with active hydrogen-containing compounds, reaction products of glycidyl compounds with acrylic acid or methacrylic acid, condensation products of N-methylol compounds with urea compounds, reaction products of polyisocyanate compounds with hydroxyalkyl acrylates or methacrylates, etc. These monomers may be used alone or in combination. Depending upon the kind of the polymeric binder, the proportion of the polymerizable monomers, the kind and amount of the photopolymerization initiator, the kind and amount of the actinic light absorber, etc., an appropriate photopolymerizable monomer(s) may be chosen. On the choice of the appropriate polymerizabel monomer(s), compatibility, film-forming property, stability, photosensitivity, etc. may be also taken into consideration. The photopolymerizable monomer(s) are favored to have higher boiling points, because otherwise they are evaporated during or after the formation of the photopolymerizable layer.

As the polymeric binder, there may be used an organic polymeric material being in a solid state at a temperature of not more than 50° C. and having a good compatibility with the polymerizable monomer(s). The polymeric binder may be thermoplastic or not but should have a good film-forming property, even after admixing with polymerizable monomers, photopolymerization initiators, actinic light absorbers, etc. Specific examples of the polymeric binder are cellulose esters or ethers, or their derivatives containing them (e.g. cellulose ethyl ether, cellulose acetate, carboxymethyl cellulose, cellulose acetate succinate, cellulose methyl ether phthalate, cellulose methyl ether succinate), polyalkyl ethers, polyesters, polyamides, polyvinyl esters, phenol resins, polyvinylidene compounds, polyvinyl alcohol, gelatin and its derivatives, polyvinyl butyral, polyacrylamide, polyvinylprrolidone, polystyrene, chlorinated rubber, polyethyleneimine, etc.

In order to make developable with an aqueous developer, the polymeric binder itself is required to be soluble or dispersible in the aqueous developer. Examples of such polymeric binder are polyvinyl alcohol, polyacrylamide, polymers containing a sulfonyl group or a carboxyl group, polymers containing a tertiary amino group quaternized with an acid, polyvinylpyrrolidone, polyethyleneimine, etc.

As the polymeric binder which is soluble in an acidic or alkaline aqueous solution, there are exemplified carboxyl group-containing cellulose derivative (e.g carboxymethyl cellulose, cellulose methyl ether phthalate), copolymers of methacrylic acid, acrylic acid, maleic acid, itaconic acid, crotonic acid, etc. with vinyl monomers, tertiary nitrogen atom-containing polyesters, polyamide or vinyl polymers, etc.

Still, said polymeric binders may have a polymerizable unsaturated double bond in their main or side chain.

As the photopolymerization initiator, there may be used any one capable of initiating a polymerization or crosslinking reaction with actinic light. Typical examples are benzophenone derivatives (e.g. benzyl, benzophenone, Michler's ketone, 4,4'-bis(diethylamino)benzophenone, 4-methoxy-4'dimethylaminobenzophenone), aromatic ketones (e.g. anthraquinone, 2-chloroanthraquinone, 2-ethylanthraquinone, 1-chloroanthraquinone, phenanthraquinone), benzoin derivatives (e.g. benzoin, benzoin alkyl ethers, alpha-methylbenzoin), benzyl-dimethyl ketal-polynuclear quinones, combinaation of 2,4,5-triarylimidazole dimers with free radical-producing agents, etc. The sensitivity of the photoinitiator may be enchanced by the additional use of a sensitizer or a sensitizing dyestuff.

As the 2,4,5-triarylimidazole dimer, there may be exemplified triphenylimidazole dimers (e.g. 2-(o-methoxyphenyl)-4,5-diphenylimidazole dimer, 2-(o-chlorophenyl)-4,5-diphenylimidazole dimer, 2-(p-methylmercaptophenyl)-4,5-diphenylimidazole dimer), polycyclic aryl-4,5-diphenylimidazole dimers (e.g. 2-(1-naphthyl)-4,5-diphenylimidazole dimer, 2-(9-anthryl)-4,5-diphenylimidazole dimer, 2-(2-methoxy-1-naphthyl)-4,5-diphenylimidazole dimer, 2-(2-chloro-1-naphthyl)-4,5-diphenylimidazole dimer), etc. As the free radical producing agents to be used in combination with 2,4,5-triarylimidazole dimers, are p-aminophenylketone compounds (e.g. p,p'bis(dimethylamino)benzophenone), leucotriphenylmethane dyestuffs (e.g. leuco-malachite green, leuco-crystal violet), cyclic diketones (e.g. 2,4-diethyl-1,3-cyclobutanedione), thioketones (e.g. 4,4'-bis(dimethylamino) thiobenzophenone), mercaptan compounds (e.g. 2-mercaptobenzothiazole), N-phenylglycine, dimedone, 7-diethylamino-4-methyl-coumarine, etc.

As the sensitizer or sensitizing dyestuff, there may be used xanthene dyestuffs, acridine dyestuffs, thiazine dyestuffs, cyanine dyestuffs, etc.

Incorporation of any compound effective in absorption of actinic light (i.e. actinic light abosorber) affords an image opaque to actinic light. By making the absorption of actinic light greater, the image area exposed through the transparent area of a mask can have an upper layer where the curing reation proceeded and a lower layer where the curing reation did not proceed. When the lower layer is kept uncured as above, the reduction property can be retained. In case of the absorption of actinic light being small, cuirng proceeds to the lower layer, and the reduction becomes impossible. If, however, the absorption is too large, only a very thin upper layer is cured, and the resist effect is inferior. The photosensitivity is also decreased. The preferred absorption of actinic light by the photopolymerizable layer is usually from 2 to 4.

As the actinic light absorber, there may be used a ultraviolet ray absorber, a ultraviolet absorption dyestuff, etc., of which specific examples are carbon black, metals, metal oxides (e.g. titanium oxide, iron oxide), metal sulfides, pigment black (C.I. 50440), chrome yellow light (C.I. 77603), 2,2'-dihydroxy-4-methoxybenzophenone, 2,4-dihydroxybenzophenonehydroxyphenylbenzotriazole, 2-(2'-hydroxy-5'-methoxyphenyl)-benzotriazole, resorcinol monobenzoate, ethyl-2-cyano-3,3-diphenylacrylate, toluidine yellow-GW (C.I. 71680), molybdenum orange (C.I. 77605), Sudan yellow (C.I. 30), oil orange (C.I. 12055), etc. Particularly, the use of carbon black is favored, because the completely opaque black as attained with conventional silver salts can be achieved. When a colorless ultraviolet ray absorber is used, the incorporation of a dyestuff or a pigment is desirable. Organic or inorganic pigments, metals, metal compounds, etc. are desired to be pulverized by any physical or chemical procedure prior to their use.

The photosensitive compostion comprises usually the polymerizable monomer in a concentration of 10 to 80% by weight (preferably 20 to 60% by weight), the polymeric binder in a concentration of 0 to 60% by weight (preferably 10 to 60% by weight) the photopolymerization initiator in a concentration of 0.3 to 20% by weight (preferably 1 to 15% by weight) and the actinic light absorber in a concentration of 5 to 40% by weight (preferaly 5 to 20% by weight).

Using the support material and the photosensitive composition as stated above, there can be prepared a photosensitive element plate by a per se conventional procedure.

With the photosensitive element, a reducible image-containing element of the invention can be prepared, for instance, according to any of the following procedures:

(1) The photosensitive element comprising a support material and a photopolymerizable layer is imagewise exposed. The resulting element is treated with a polyvalent phenol or its derivative prior to development, i.e. elimination of the photosensitive composition at the non-exposed area;

(2) The photosensitive element comprising a support material and a photopolymerizable layer is imagewise exposed. For development, a developer containing a polyvalent phenol or its derivative is used so that elimination of the photosensitive composition at the non-exposed area and treatment with a polyvalent phenol or its derivative are accomplished simultaneously;

(3) The photosensitive element comprising a support material and a photopolymerizable layer is imagewise exposed, followed by developement. The developed element is treated with a polyvalent phenol or its derivative.

As the result of application of the above procedure, the polyvalent phenol or its derivative can be retained in the non-cured photosensitive composition at the lower part of the image area. Retention may be achieved physically or chemically.

The polyvalent phenol or its derivative to be used is desired to have a high boiling point so that it is hardly lost by evaporation prior to the reduction. It is also desired to be hardly decomposed so that its effect can be retained over a long period of time. It is further desired to be readily handled, not to exert any material toxicity and to be available at a low cost. Particularly when it is employed in a solution state for treatment of the element, the use of an organic solvent as the solvent is not favorable from the viewpoint of handling and cost. It is thus favored to be usable in the state of aqueous solution or dispersion.

Examples of the polyvalent phenol or its derivative are divalent phenols and their alkylated and/or alkyl etherified derivatives (e.g. hydroquinone, p-t-butylcatechol, mono-t-butylhydroquinone, 2,5-di-t-amylhydroquinone, hydroquinone monomethyl ether, resorcinol, catechol, 2-methylresorcinol, methylhydroquinone, guajacol and resorcinal monomethyl ether, trivalent phenols and their alkylated and/or alkyl etherified derivatives (e.g. pyrogallol, tannic acid and pyrogallol-1,3-dimethyl ether), etc. Among them, particularly preferred are catechol, resorcinol, hydroquinone, pyrogallol, 2-methylresorcinol, methylhydroquinone, guajacol, resorcinol monomethyl ether, hydroquinone monomethyl ether, pyrogallol-1,3-dimethyl ether, etc. These may be used alone or in combination. For the purpose of enhancing their performances, any treating aid such as a surfactant may be used.

As the developer usable in the above procedure, there are exemplified aqueous solutions of alkali metal hydroxides or carbonates (e.g. lithium hydroxide, sodium hydroxide, potassium hydroxide, sodium carbonate, sodium bicarbonate, potassium carbonate), aqueous solutions of organic or inorganic acids (e.g. hydrochloric acid, formic acid, oxalic acid), water, etc.

The image-containing element of the invention as can be reduced should contain the polyvalent phenol or its derivative in an effective amount for retention of the reduction property. The effective amount is varied with the kind of the polyvalent phenol or its derivative. Further, the conditions under which the element is treated with the polyvalent phenol or its derivative such as dipping time may be appropriately decided so as to have the effective amount retained. Usually, dipping in an aqueous solution containing the polyvalent phenol or its derivative in a concentration of about 0.05 to 5% by weight for a period of 5 to 30 seconds makes the concentration of the polyvalent phenol or its derivative as retained in the image area of the element at a level of about 0.01 to 3% by weight.

As explained above, the present invention solves the drawback as recognized in conventional non-silver salt litho-films, i.e. the loss of the reduction property, by a simple procedure. The image-containing element of the invention retains its reduction property satisfactorily under various conditions.

Practical and presently preferred embodiments of the invention are illustratively shown in the following Examples wherein part(s) and % are by weight.

EXAMPLE 1

Onto a polyester film of 100 microns in thickness, an undercoating composition comprising the following materials was applied by the aid of a reverse coater to make an undercoating layer of 0.5 micron in thickness (after drying):

|  | Part(s) |
| --- | --- |
| "Byron 20S" (a saturated polyester adhesive agent; manufactured by Toyobo Co., Ltd.) | 50 |
| "Collonate L" (1,8-diaza-bicyclo-[5,4,0]undecene-7-octylic acid salt; manufactured by Nippon Polyurethane Kogyo) | 4 |
| "U-Cat SA-No. 102" (the reaction product of trimethylolpropane and 2,4-tolylene diisocyanate in a molar ratio of 1:3; manufactured by Sun Abbot) | 0.1 |
| Toluene | 80 |
| Methylethylketone | 20 |

Onto the undercoating layer as above formed, a photosensitive composition comprising the following materials was applied by the aid of a reverse coater to make a photopolymerizable layer of 4 microns in thickness:

|  | Part(s) |
| --- | --- |
| Copolymer of methyl methacrylate and methacrylic acid (70:30 by mol) | 41 |
| Carbon black | 12 |
| Trimethylolpropane triacrylate | 34 |
| 2-(2-Chloro-1-naphthyl)-4,5-diphenylimidazole dimer | 8 |
| Hydroquinone monomethyl ether | 0.03 |
| Dimedone | 3 |
| Michler's ketone | 2 |
| Methanol | 140 |
| Chloroform | 120 |
| Ethyl acetate | 80 |
| n-Propyl acetate | 40 |
| Isopropanol | 40 |

Onto the photopolymerizable layer as above formed, a protective composition comprising the following materials was applied in the same matter as above to make a protective layer of 1 micron in thickness:

|  | Part(s) |
| --- | --- |
| Polyvinyl alcohol (saponification degree, 98.5%; degree of polymerization, 500) | 5 |
| "Noigen EA-140" (polyoxyethylene nonyl phenyl ether; manufactured by Daiichi Kogyo Seiyaku) | 0.2 |
| Methanol | 5 |
| Water | 90 |

Onto the thus prepared photosensitive film, a negative film prepared by combining a step guide (21 steps; manufactured by Dainippon Screen) with halftone dots (150 lines/inch; 5–95%) was placed to make a close contact, and imagewise exposure was effected by the use of a bright room printer (manufactured by ORC) for 20 seconds. The resulting film was washed with water to eliminate the protective layer, immersed in 1% $Na_2CO_3$ aqueous solution kept at 30° C. for 10 seconds and scrubbed with a sponge while water rinsing, followed by drying to give an inversed image. Curing took place up to 5 steps of the step guide, and the halftone dots were well reproduced.

The image containing film prepared in the same manner as above was dipped in 5% aqueous solution of hydroquinone kept at 30° C. for 20, 30 or 60 seconds and then washed with water, following by drying.

The image-containing film as treated above or not were allowed to stand in a room (daytime, 800 lux), and variation of the reduction property with time was measured. Reduction was carried out by dipping in an aqueous solution containing 5% $Na_2CO_3$ and 0.1% "Noigen EA-140" kept at 20° C. for 60 seconds and scrubbing with a sponge while water rinsing. The results are shown in the following Table.

TABLE

| No. | Treated with hydroquinone solution | Decrease of 53% dotted area after being allowed to stand in a room (%) | | | |
| --- | --- | --- | --- | --- | --- |
| | | Immediately after | After 1 day | After 2 days | After 7 days |
| 1 | Non-treated | 37 | 19 | 8 | 2 |
| 2 | 10 seconds | 41 | 27 | 18 | 18 |
| 3 | 20 seconds | 40 | 32 | 18 | 19 |
| 4 | 30 seconds | 41 | 33 | 21 | 21 |
| 5 | 60 seconds | 41 | 34 | 24 | 24 |

Note:
Measurement of dotted area made by the use of a dot meter DT-101 (manufactured by Dainippon Screen)

As understood from the above results, the present invention is effective in suppressing satisfactorily the degrees of the reduction property due to the progress of the reaction while being allowed to stand in a room. When the invention is not applied, the reduction property is markedly decreased even after several days, and the reduction becomes impossible.

EXAMPLE 2

The image-containing film prepared in the same manner as in Example 1 was dipped in an aqueous solution containing 4% hydroquinone and 0.2% "Noigen EA-140" for 60 seconds and then washed with water, followed by drying.

Using the thus treated image-containing film as a negative film, printing was carried out on a negative type PS plate "SGN-II" (manufactured by Fuji Photograph Film) with a 2 KW mercury lamp (manufactured by ORC). Then, said negative film was subjected to reduction in the same manner as in Example 1. The decrease of 53% dotted area was 28%.

In the same manner as above but using the image-containing film not treated with the hydroquinone containing solution, reduction was tested. The decrease of 53% dotted area was only 2%.

EXAMPLE 3

The photosensitive film as prepared in Example 1 was imagewise exposed by the use of a negative film for testing and washed with water to eliminate the protective layer. The resulting film was dipped in an aqueous solution containing 4% hydroquinone, 1% $Na_2SO_3$ and 0.3% $Na_2CO_3$ for 45 seconds and scrubbed with a sponge while water rinsing. The resultant film retained reduction property such as 28% decrease of 53% dotted area even after exposure to light of a bright room printer (manufactured by ORC) from the side of the support material for 30 seconds. The film not treated showed no material reduction property.

EXAMPLE 4

The photosensitive film as prepared in Example 1 was imagewise exposed by the use of a negative film for testing and washed with water to eliminate the protective layer. The resulting film was dipped in an aqueous solution containing 4% hydroquinone, and 0.4% "Niogen EA-140" for 3 minutes. Then, the resulting film was dipped in 1% $Na_2CO_3$ aqueous solution for 8 seconds and scrubbed with a sponge while water rinsing. The resultant film retained reduction property such as 20% decrease of 53% dotted area even after exposure to light of a bright room printer (manufactured by ORC) from the side of the support material for 30 seconds. The film not treated showed only slight reduction property such as 2% decrease of 53% dotted area.

What is claimed is:

1. A reducible image-containing element usable as a litho-film which comprises a transparent support material and a photopolymerized layer provided thereon, said photopolymerized layer having an image area which is cured at a higher degree of curing at the upper part and at a lower degree of curing at the lower part, said upper part having a higher degree of curing not being in contact with a photomask, said lower part having a lower degree of curing containing at least one curing prevention agent selected from the group consisting of polyvalent phenols and alkylated or alkyl etherified derivatives thereof in an amount effective in preventing said lower part from curing, said curing prevention agent being introduced into said image area at said lower part after imagewise exposure.

* * * * *